(12) United States Patent
Fushie et al.

(10) Patent No.: US 8,002,959 B2
(45) Date of Patent: Aug. 23, 2011

(54) MANUFACTURING METHOD OF DOUBLE-SIDED WIRING GLASS SUBSTRATE

(75) Inventors: Takashi Fushie, Setagaya-ku (JP); Norimichi Annaka, Nirasaki (JP); Takeshi Kagatsume, Hachioji (JP)

(73) Assignee: Hoya Corporation, Tokyo (JP)

( * ) Notice: Subject to any disclaimer, the term of this patent is extended or adjusted under 35 U.S.C. 154(b) by 1297 days.

(21) Appl. No.: 11/369,002

(22) Filed: Mar. 7, 2006

(65) Prior Publication Data

US 2006/0201201 A1 Sep. 14, 2006

Related U.S. Application Data

(63) Continuation of application No. PCT/JP2004/012719, filed on Sep. 2, 2004.

(30) Foreign Application Priority Data

Sep. 9, 2003 (JP) ................................ 2003-316133

(51) Int. Cl.
C25D 5/02 (2006.01)

(52) U.S. Cl. ...................................... 205/125

(58) Field of Classification Search .................. 205/125, 205/162; 174/262; 438/687
See application file for complete search history.

(56) References Cited

U.S. PATENT DOCUMENTS

| 3,646,572 | A | | 2/1972 | Burr | |
|---|---|---|---|---|---|
| 5,262,041 | A | * | 11/1993 | Gulla | ............................ 205/125 |
| 5,911,863 | A | | 6/1999 | Vetter et al. | |
| 6,199,273 | B1 | | 3/2001 | Kubo et al. | |
| 6,339,197 | B1 | * | 1/2002 | Fushie et al. | .................. 174/262 |
| 6,852,627 | B2 | * | 2/2005 | Sinha et al. | .................... 438/687 |
| 2002/0004301 | A1 | * | 1/2002 | Chen et al. | ..................... 438/687 |
| 2002/0066672 | A1 | | 6/2002 | Iijima et al. | |
| 2002/0170173 | A1 | | 11/2002 | Mashino | |
| 2006/0201818 | A1 | | 9/2006 | Fushie et al. | |

FOREIGN PATENT DOCUMENTS

| DE | 42 01 612 A1 | 7/1993 |
|---|---|---|
| JP | 63-128699 | 6/1988 |
| JP | 03203341 A | 9/1991 |
| JP | 6-275954 | 9/1994 |
| JP | 06275954 A * | 9/1994 |
| JP | 11-177200 | 7/1999 |
| JP | 2000-077568 A | 3/2000 |
| JP | 2000-077809 A | 3/2000 |
| JP | 2000-133945 A | 5/2000 |
| JP | 2001-44639 | 2/2001 |
| JP | 2003-060330 A | 2/2003 |

OTHER PUBLICATIONS

International Search Report of International Application PCT/JP2004/012719 mailed Nov. 16, 2004.
Supplementary European Search Report dated Apr. 20, 2009, issued in corresponding European Patent Application No. 04772674.0/1232.
Supplementary European Search Report dated Apr. 20, 2009, issued in corresponding European Patent Application No. 04772673.2-1232.

* cited by examiner

*Primary Examiner* — Luan V Van
(74) *Attorney, Agent, or Firm* — Westerman, Hattori, Daniels & Adrian, LLP

(57) ABSTRACT

To improve thermal resistance of a double-sided wiring glass substrate. A through-hole is filled with a copper post composed of metallic copper to thereby electrically connect the front and rear surfaces of the double-sided wiring glass substrate. The filling with the copper post is performed by first sealing, with copper, one opening part of the through-hole using an electrolytic plating method and then further plating copper from the one sealed opening part to the other opening part. As a result, the front and rear surfaces of the double-sided wiring glass substrate can be surely electrically connected as well as high thermal resistance of the whole double-sided wiring glass substrate can be secured.

5 Claims, 12 Drawing Sheets

MANUFACTURING METHOD OF DOUBLE-SIDED WIRING GLASS SUBSTRATE

This application is a continuing application, filed under 35 U.S.C. §111(a), of International Application PCT/JP2004/012719, filed Sep. 2, 2004, it being further noted that priority is based upon Japanese Patent Application No. 2003-316133, filed Sep. 9, 2003.

BACKGROUND OF THE INVENTION

1. Field of the Invention

The present invention relates to a method for manufacturing a double-sided wiring glass substrate. Particularly, the present invention relates to a method for manufacturing a double-sided wiring glass substrate having on the front and rear surfaces thereof wirings and capable of mounting thereon various electronic parts.

2. Description of the Related Art

In recent years, there has been rapidly developed a MEMS (Micro Electro Mechanical System) in which function elements such as a sensor or a switch are constituted on a chip using an IC manufacturing technology, and as a result, dramatic miniaturization and high performance of electronic parts are being realized. In keeping with this trend, there is desired a wiring substrate capable of densely mounting with high reliability at low cost various conventional electronic parts and other electronic parts (hereinafter, referred to as "electronic parts") using the MEMS.

Conventionally, there is known a wiring substrate using as a core substrate material thereof a ceramic substrate, a glass epoxy substrate or a glass substrate. Particularly, in the case of the glass substrate, many photosensitive glass substrates capable of forming a hole or a groove using a photolithographic method are used. An example of the wiring substrate using the photosensitive glass substrate includes a multilayer wiring substrate (see, Japanese Unexamined Patent Application Publication No. Sho 63-128699 (p 4, column 2, lines 6 to 19)). The multilayer wiring substrate is formed as follows. That is, a through-hole or wiring groove formed in the photosensitive glass substrate using the photolithographic method is filled with conductive paste by a screen printing method to form a wiring substrate. In the same manner, a plurality of the wiring substrates are formed. Then, the wiring substrates are laminated and calcined. Another example of the wiring substrate using the photosensitive glass substrate includes a build-up multilayer wiring substrate (see, Japanese Unexamined Patent Application Publication No. 2001-44639 (paragraph numbers [0030] to [0084], and FIGS. 1 to 6)). The build-up multilayer wiring substrate is formed as follows. That is, a conductive film is formed on a through-hole inner wall and a wiring using a plating method. Then, a resin insulating material is formed in the through-hole inside and between the wirings after the conductive film formation.

The wiring substrate for mounting electronic parts is required to have the following conditions. First, since a calcination temperature of an inorganic jointing paste commonly used in jointing electronic parts and a wiring substrate may be as extremely high as 400° C. or more, the substrate must have high thermal resistance. Secondly, the wirings must be densely formed for mounting many small electronic parts, particularly, many ultrasmall ones using the MEMS. Thirdly, the wirings must be formed on the substrate front and rear surfaces for improvement in mounting density.

In a wiring substrate using a photosensitive glass substrate, when using as a core substrate of the wiring substrate a glass substrate having high thermal resistance, a problem in thermal resistance as the wiring substrate can be avoided. However, in the case of performing filling of a through-hole with conductive paste or formation of wirings by a screen printing method, there may arise a problem that a void is generated in a conductive part formed within the through-hole or minute wirings are unable to be densely formed. Therefore, there are many cases of using a glass substrate having high thermal resistance as well as of forming a through-hole inside conductive part or wirings using the photolithographic method or plating method to cope with thermal resistance as well as miniaturization and density growth. However, in the case of thinly forming a conductive film on a through-hole inner wall, for example, by a plating method and then further filling the through-hole inside with a resin, there arises a problem that even if using a glass substrate having high thermal resistance, the thermal resistance as the whole wiring substrate is reduced. These problems similarly occur both in forming a multilayer wiring substrate and in forming a single layer wiring substrate serving also as a fundamental structure of the multilayer wiring substrate.

SUMMARY OF THE INVENTION

In view of the foregoing, it is an object of the present invention to provide a method for manufacturing a double-sided wiring glass substrate having high thermal resistance and capable of densely forming on the front and rear surfaces thereof minute wirings.

Means for Solving the Problems

To accomplish the above object, according to the present invention, there is provided a method for manufacturing a double-sided wiring glass substrate having electric wirings formed on the front and rear surfaces of a glass substrate, and a through-hole filled with a metal penetrates the glass substrate, the respective electric wirings formed on the front and rear surfaces of the glass substrate being made electrically connective through the metal filling the through-hole, the method comprising the steps of: a first step of forming the through-hole in the glass substrate; and a second step of filling the through-hole inside with a metal by a plating method.

According to the present invention, there is also provided a method for manufacturing a double-sided wiring glass substrate, wherein the metal filling the through-hole is composed of any one or more of copper, nickel, gold, silver, chromium and aluminum.

According to the present invention, there is also provided a method for manufacturing a double-sided wiring glass substrate, wherein a photosensitive glass substrate is used as the glass substrate, and the first step comprises: a step of exposing the glass substrate through a photomask to form a latent image on a part of the glass substrate in which the through-hole is formed; a step of subjecting the glass substrate to thermal treatment to crystallize the exposed part; and a step of removing by dissolving the crystallized part to form the through-hole in the glass substrate.

According to the present invention, there is also provided a method for manufacturing a double-sided wiring glass substrate, wherein the second step is a step of filling the through-hole inside with a metal by an electrolytic plating method, the second step comprises, sealing with a metal any one of opening parts of the through-hole in the front and rear surfaces of the glass substrate at an initial stage of the step, and subsequently depositing the metal from the one sealed opening part to the other opening part to thereby fill the through-hole inside with the metal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
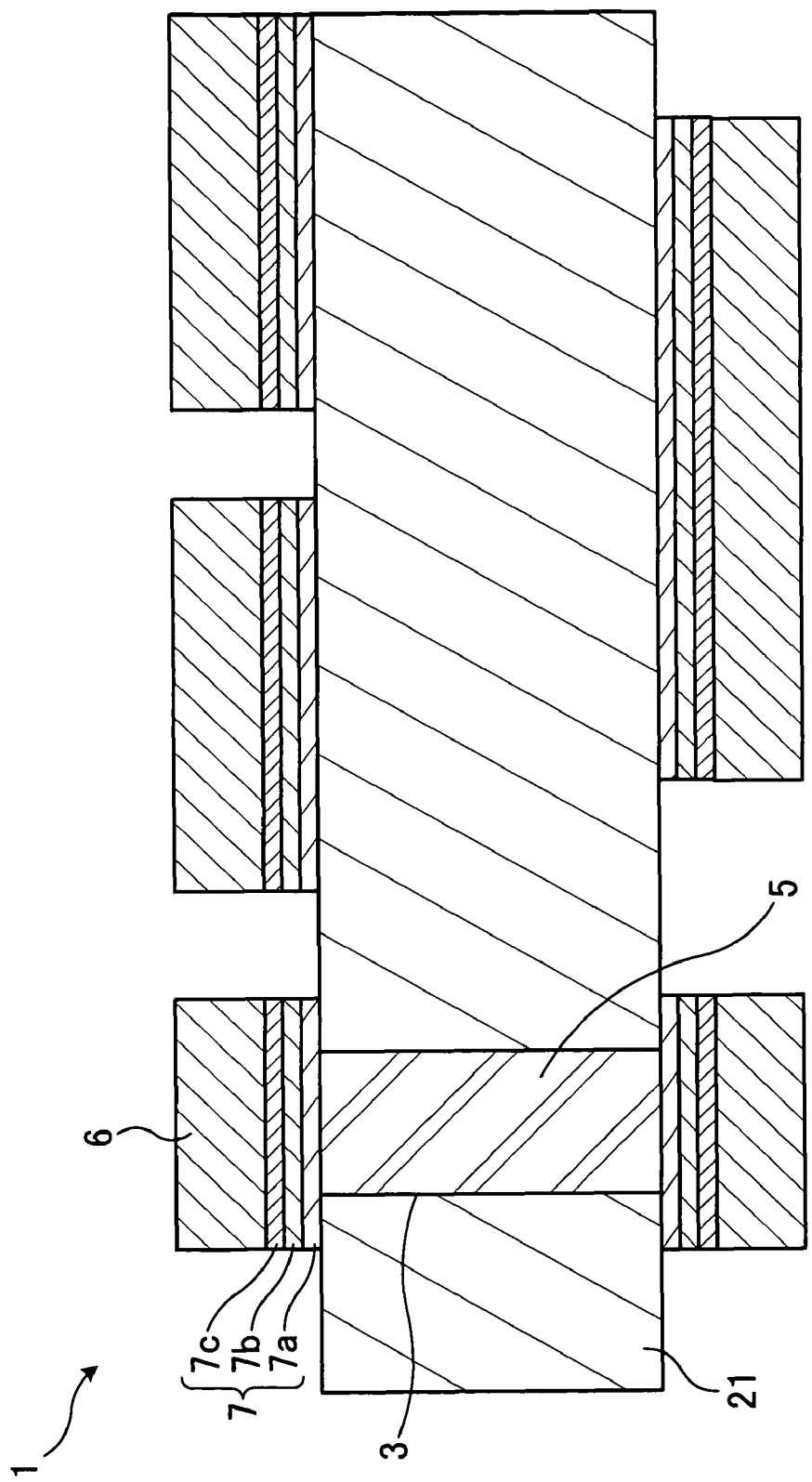
FIG. 1 is a sectional view of one example of a double-sided wiring glass substrate.

Preferred embodiments of the present invention will be described below with reference to the accompanying drawings, wherein like reference numerals refer to like elements throughout.

FIG. 1 is a sectional view of one example of a double-sided wiring glass substrate.

In a double-sided wiring glass substrate 1, a crystallized glass substrate 21 obtained by crystallizing a photosensitive glass substrate is used as a core substrate thereof. The substrate 21 has a through-hole 3 penetrating the substrate 21. The through-hole 3 is filled with a copper post 5 composed of metallic copper (Cu). On the substrate 21 and the copper post 5, a copper film layer 6 serving as wirings is formed with a predetermined wiring pattern through an adhesion-reinforcing layer 7. Thus, a front surface side and rear surface side of the double-sided wiring glass substrate 1 are electrically connected by the post 5 and a part of the layer 7 and layer 6 formed on the post 5.

Herein, the photosensitive glass substrate as a precursor of the crystallized glass substrate 21 is excellent as a core substrate material of a wiring substrate in terms of smoothness, hardness, insulation, and workability. These properties are the same as in chemically strengthened glass such as soda-lime glass, alkali-free glass, and aluminosilicate glass in addition to the crystallized glass as described above. The glass can also be used for the core substrate of the double-sided wiring glass substrate 1.

The adhesion-reinforcing layer 7 is composed of a chromium (Cr) layer (hereinafter, referred to as a "sputtering chromium layer") 7a formed by a sputtering method, a mixed layer (hereinafter, referred to as a "sputtering chromium copper layer") 7b of chromium and copper formed by a sputtering method, and a copper layer (hereinafter, referred to as a "sputtering copper layer") 7c formed by a sputtering method. Herein, the layer 7 has a three-layer structure where the sputtering chromium layer 7a, the sputtering chromium copper layer 7b, and the sputtering copper layer 7c are laminated in sequence on the crystallized glass substrate 21.

The copper film layer 6 serving as wirings is formed on the sputtering copper layer 7c, and a part of the layer 6 is connected through the adhesion-reinforcing layer 7 to the copper post 5 filling the through-hole 3.

Next, a more detailed constitution of the double-sided wiring glass substrate 1 and a manufacturing method thereof will be described.

A manufacturing process of the double-sided wiring glass substrate 1 is roughly divided into a through-hole formation step, a glass substrate reforming step, a through-hole filling step, an adhesion-reinforcing layer formation step and a wiring formation step.

Figure 2:
FIG. 2 is a sectional view of an exposure step.
Figure 3:
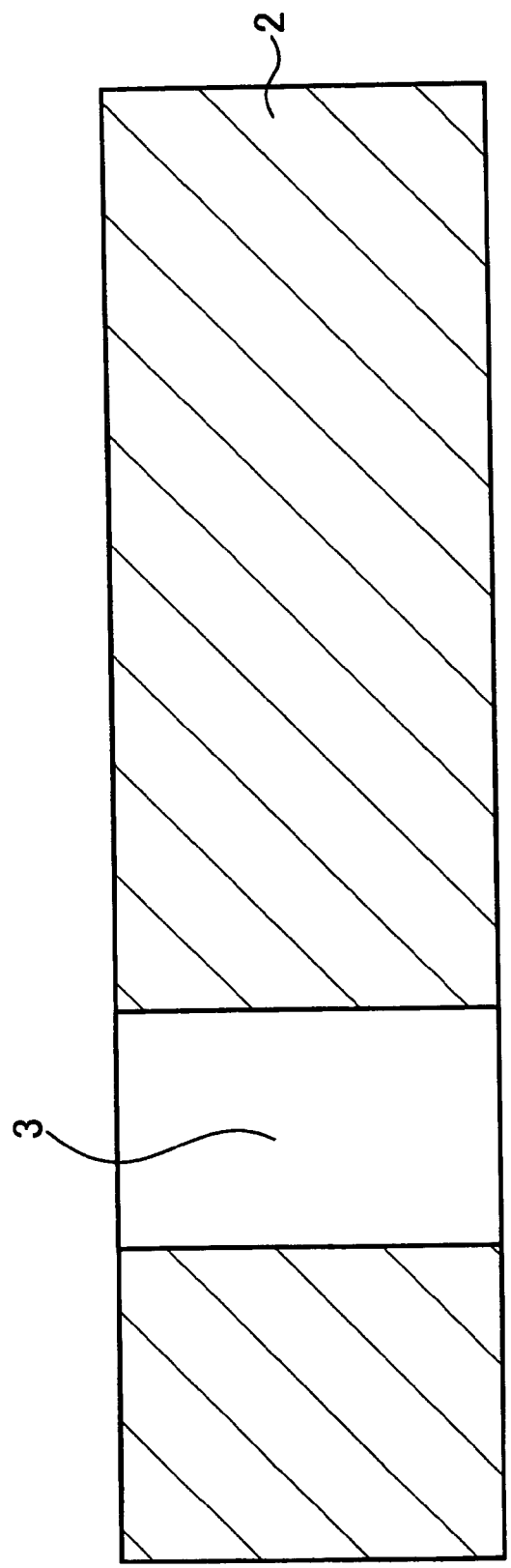
FIG. 3 is a sectional view of an exposure-crystallized part removal step.

First, the through-hole formation step will be described. FIGS. 2 and 3 are explanatory views of the through-hole formation step. FIG. 2 is a sectional view of an exposure step. FIG. 3 is a sectional view of an exposure-crystallized part removal step.

In the through-hole formation step, first, a photomask (not shown) having an opening part only in an area corresponding to a part (hereinafter, referred to as a "through-hole formation part") for forming the through-hole 3 is brought into close contact with and disposed on one surface side of the front and rear surfaces of the photosensitive glass substrate 2. In this state, ultraviolet rays are emitted onto the substrate 2.

The photosensitive glass substrate 2 is not particularly limited, and any substrate may be used as long as it shows photosensitivity. The substrate 2 preferably contains as a photosensitive component thereof at least one of gold (Au), silver (Ag), cuprous oxide ($Cu_2O$) or cerium oxide ($CeO_2$), more preferably contains two or more thereof. As the substrate 2, for example, there can be used a glass substrate containing, in terms of wt %, 55 to 85% $SiO_2$, 2 to 20% $Al_2O_3$, 5 to 15% $Li_2O$, and $SiO_2+Al_2O_3+Li_2O>85\%$ as a basic component; 0.001 to 0.05% Au, 0.001 to 0.5% Ag, and 0.001 to 1% $Cu_2O$ as a photosensitive metallic component; and 0.001 to 0.2% $CeO_2$ as a photosensitizer.

Further, the photomask is not particularly limited, and any mask may be used as long as it can be brought into close contact with the photosensitive glass substrate 2 and allows selective exposure of the through-hole formation part. As the photomask, for example, there may be used a photomask made of a thin transparent plate glass having formed thereon a light shielding pattern using a film such as a chromium film substantially opaque to the exposure light such as ultraviolet rays.

After thus irradiating ultraviolet rays onto the through-hole formation part of the photosensitive glass substrate 2 through a photomask, this photosensitive glass substrate 2 is subjected to thermal treatment. The thermal treatment is preferably performed at a temperature between the transition point and deformation point of the substrate 2 used. This is because at temperatures lower than the transition point, satisfactory thermal treating effects are not obtained, and at temperatures exceeding the deformation point, shrinkage of the substrate 2 occurs, which may cause lowering of the exposure dimensional accuracy. The thermal treatment is preferably performed for a period of about 30 minutes to 5 hours.

Through the ultraviolet irradiation and the thermal treatment, the through-hole formation part irradiated with ultraviolet rays is crystallized, whereby an exposure-crystallized part 3a is formed on the through-hole formation part of the photosensitive glass substrate 2, as shown in FIG. 2. Subsequently, an etching solution such as dilute hydrofluoric acid having a predetermined concentration is sprayed on the substrate 2 having formed therein the part 3a, whereby the part 3a is selectively removed by resolution from the substrate 2. Thus, the through-hole 3 is formed in the substrate 2, as shown in FIG. 3.

According to the forming method of the through-hole 3 using the photolithographic method, just a desired number of the through-holes 3 with an aspect ratio of about 10 can be simultaneously formed in the photosensitive glass substrate 2. For example, in the case of using the substrate 2 having a thickness of about 0.3 to 1.5 mm, a plurality of the through-holes 3 with a diameter of about 30 to 150 μm can be formed simultaneously at desired locations. As a result, formation of fine wiring patterns and improvement of efficiency in the through-hole formation step can be attained. Further, in the case of employing a landless structure in which the land width is reduced to a very small value or zero in order to increase the density of wiring patterns, a sufficiently large space can be secured between the through-holes 3. As a result, wirings can be formed also in the space between the through-holes 3, so that the degree of freedom in wiring pattern design can be expanded as well as the wiring density can be increased. Further, a plurality of the through-holes 3 can be formed at a narrow pitch, so that the wiring density can be increased.

When using other glass substrates having no photosensitivity as in the photosensitive glass substrate 2, a through-hole can be formed, for example, by laser irradiation.

Next, the glass substrate reforming step will be described.

The photosensitive glass substrate 2 usually contains alkali metal ions such as a lithium ion (Li+) and a potassium ion (K+). When these alkali metal ions leak from the substrate 2 to a wiring metal of the double-sided wiring glass substrate 1 and further, water is adsorbed to the wiring metal, there is caused an ion migration phenomenon that the wiring metal is ionized between circuits to which a voltage is applied, and the wiring metal ionized is reduced by receiving a charge to allow the metal to be separated out again. Due to the ion migration, in the worst case, a wiring which goes from one circuit to another circuit is formed by the separated metal and as a result, a short circuit is caused between circuits. Such a short-circuit defect becomes remarkable when a space between wirings is small. Therefore, in order to form fine wirings with high density, the ion migration must be inhibited.

In the glass substrate reforming step, the whole photosensitive glass substrate 2 having formed therein the through-hole 3 is irradiated, for example, with ultraviolet rays in an exposure amount of about 700 mJ/cm$^2$, and then subjected to thermal treatment at a temperature of about 850° C. for about two hours. Thus, the whole substrate 2 is crystallized. When thus crystallizing the whole substrate 2, alkali metal ions contained in the substrate 2 can be made into a state of difficulty in moving as compared with a state before the crystallization. Therefore, the ion migration can be suppressed.

Figure 4:
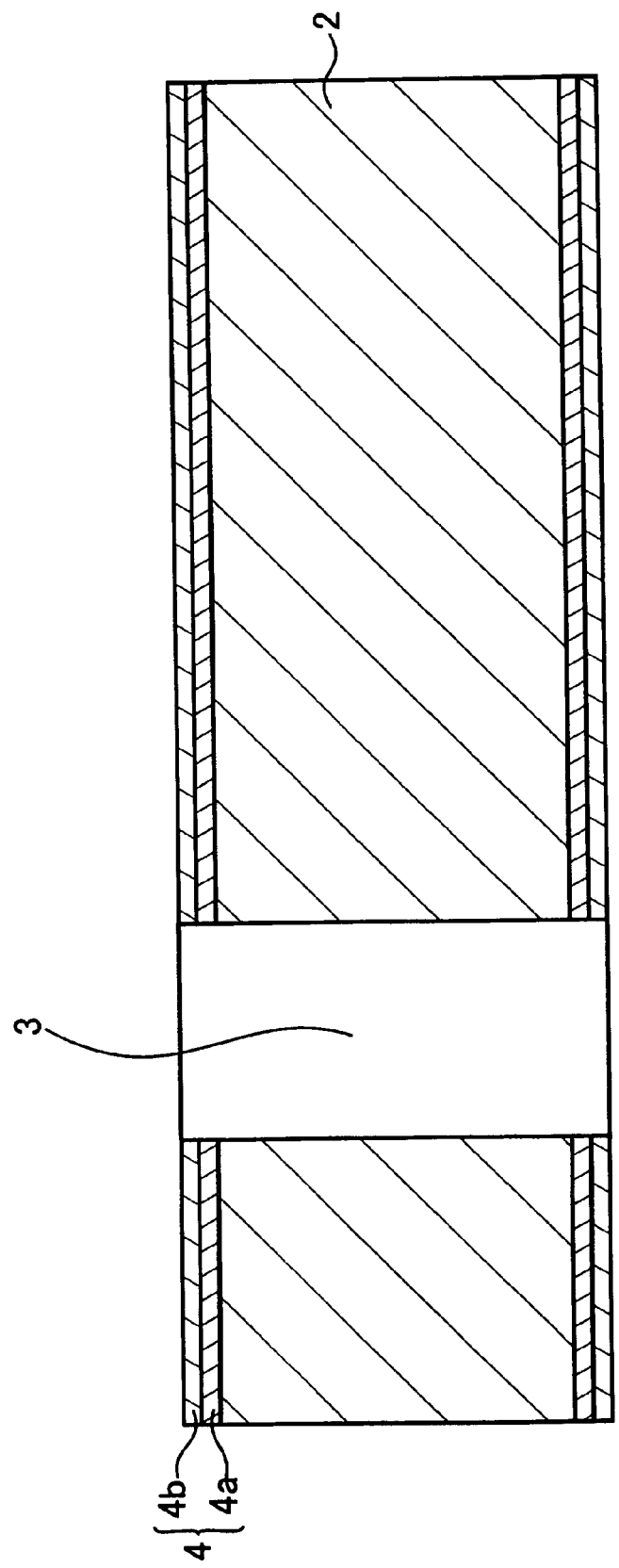
FIG. 4 is a sectional view of an ion blocking layer formation step.

Further, as a method for suppressing the ion migration, a method for providing an ion blocking layer can also be employed. FIG. 4 is a sectional view of an ion blocking layer formation step.

When forming the ion blocking layer 4, the photosensitive glass substrate 2 is first subjected to dealkalization treatment for removing alkali metal ions contained in the front and rear surface areas of the substrate 2. The dealkalization treatment is performed by immersing the substrate 2 in an electrolyte such as a sulfuric-acid aqueous solution, and then applying a voltage to the substrate 2 to allow the alkali metal ions contained in the front and rear surface areas of the substrate 2 to be eluted in the electrolyte.

After completion of the above-described dealkalization treatment, the ion blocking layer 4 is formed on each of the front and rear surfaces of the photosensitive glass substrate 2, as shown in FIG. 4. For the ion blocking layer 4, any of organic and inorganic materials may be used. A material which has insulation as well as small difference in thermal expansion coefficient between the substrate 2 and the layer 4 and which is excellent in electrical characteristics such as thermal resistance, moisture resistance, a dielectric constant or a dielectric dissipation factor is preferably used. Materials satisfying these requirements include silicon oxide, silicon nitride and aluminum oxide. Among these, silicon oxide and silicon nitride are more preferred in that a defect such as a pinhole is hardly formed and a withstand voltage is high. The film forming method is not particularly limited and a sputtering method, a vacuum deposition method, and a CVD (Chemical Vapor Deposition) method may be used. In terms of providing high adhesion, a sputtering method is preferably used. For example, as shown in FIG. 4, the sputtering silicon nitride layer 4a having a film thickness of about 0.05 μm is first formed on each of the front and rear surfaces of the photosensitive glass substrate 2 after the dealkalization treatment and then, a sputtering silicon oxide layer 4b having a film thickness of about 0.05 μm is formed on the layer 4a. Thus, the layer 4 is constituted.

The ion blocking layer 4 may be formed without dealkalizing the substrate 2. Further, the crystallized glass substrate 21 may be constituted to have a structure of a single layer or three layers or more depending on the ion blocking layer 4 materials used.

Figure 5:
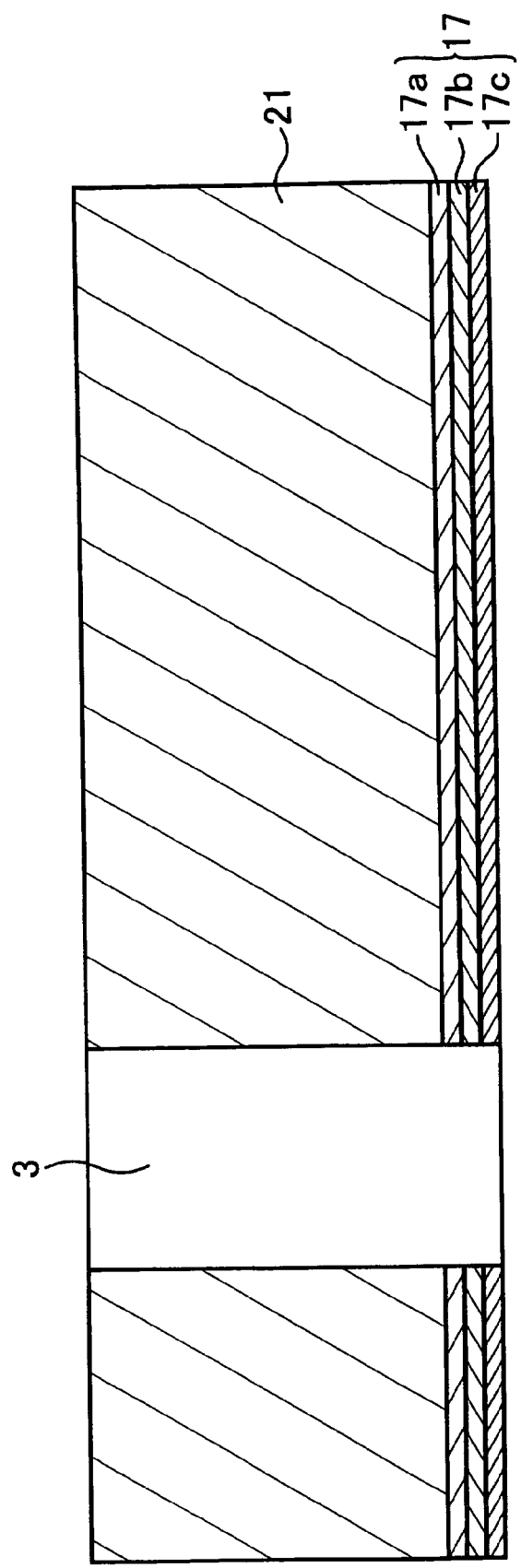
FIG. 5 is a sectional view of an electrode layer formation step.
Figure 6:
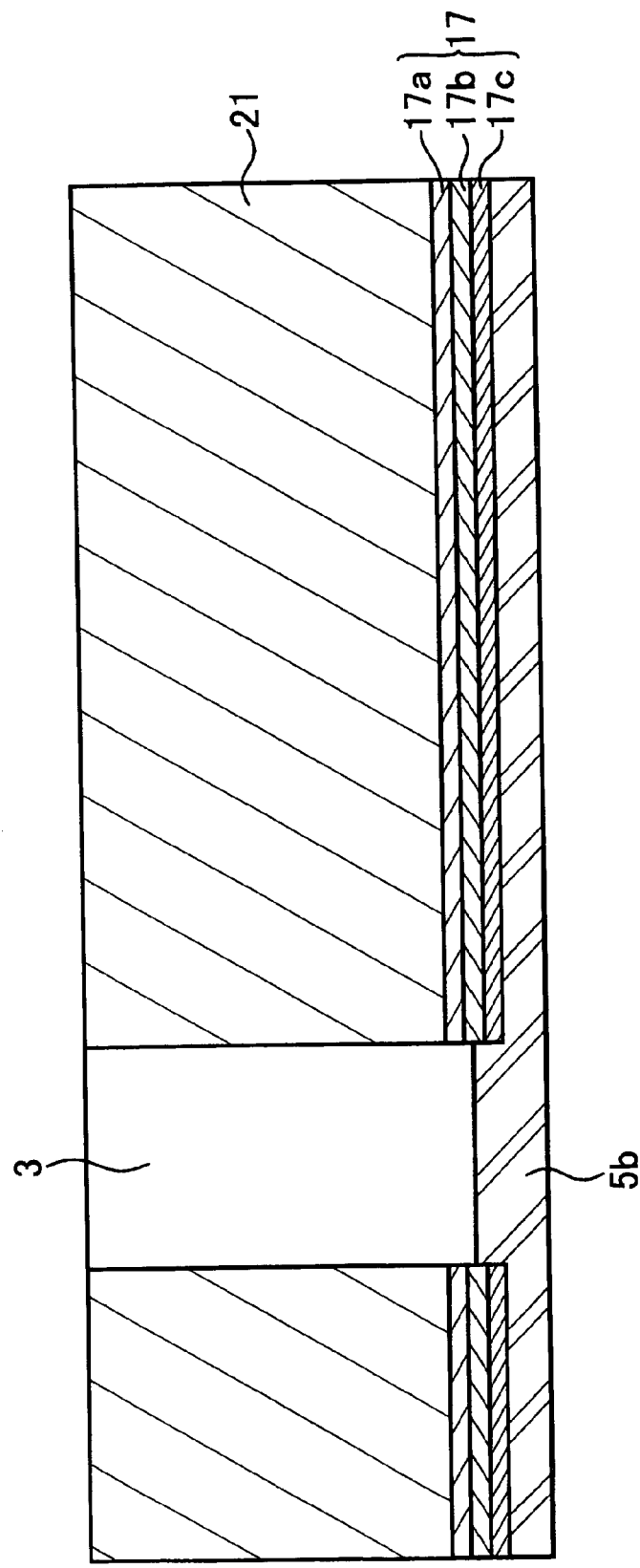
FIG. 6 is a sectional view of an opening part sealing step.
Figure 7:
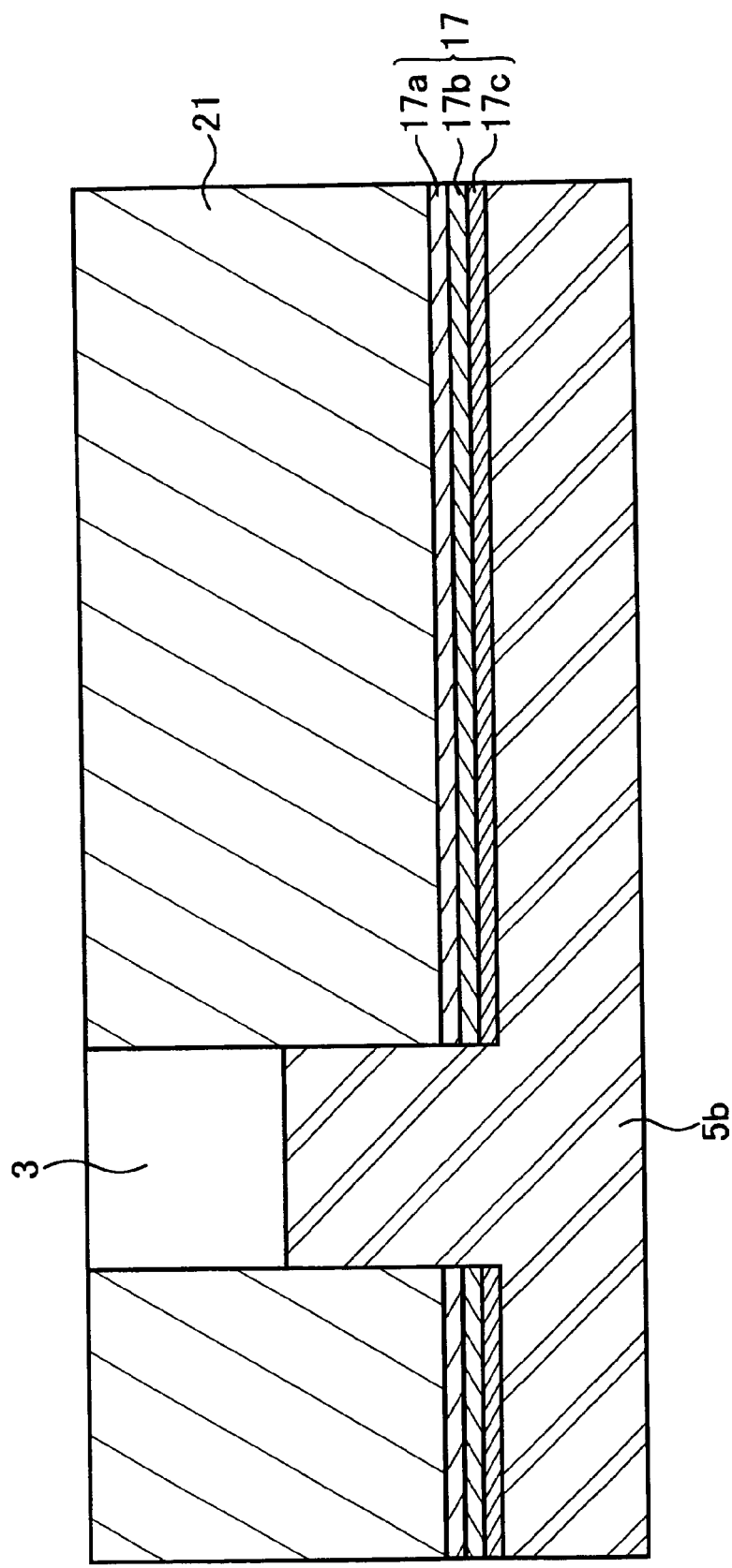
FIG. 7 is a first sectional view of an electrolytic plating step.
Figure 8:
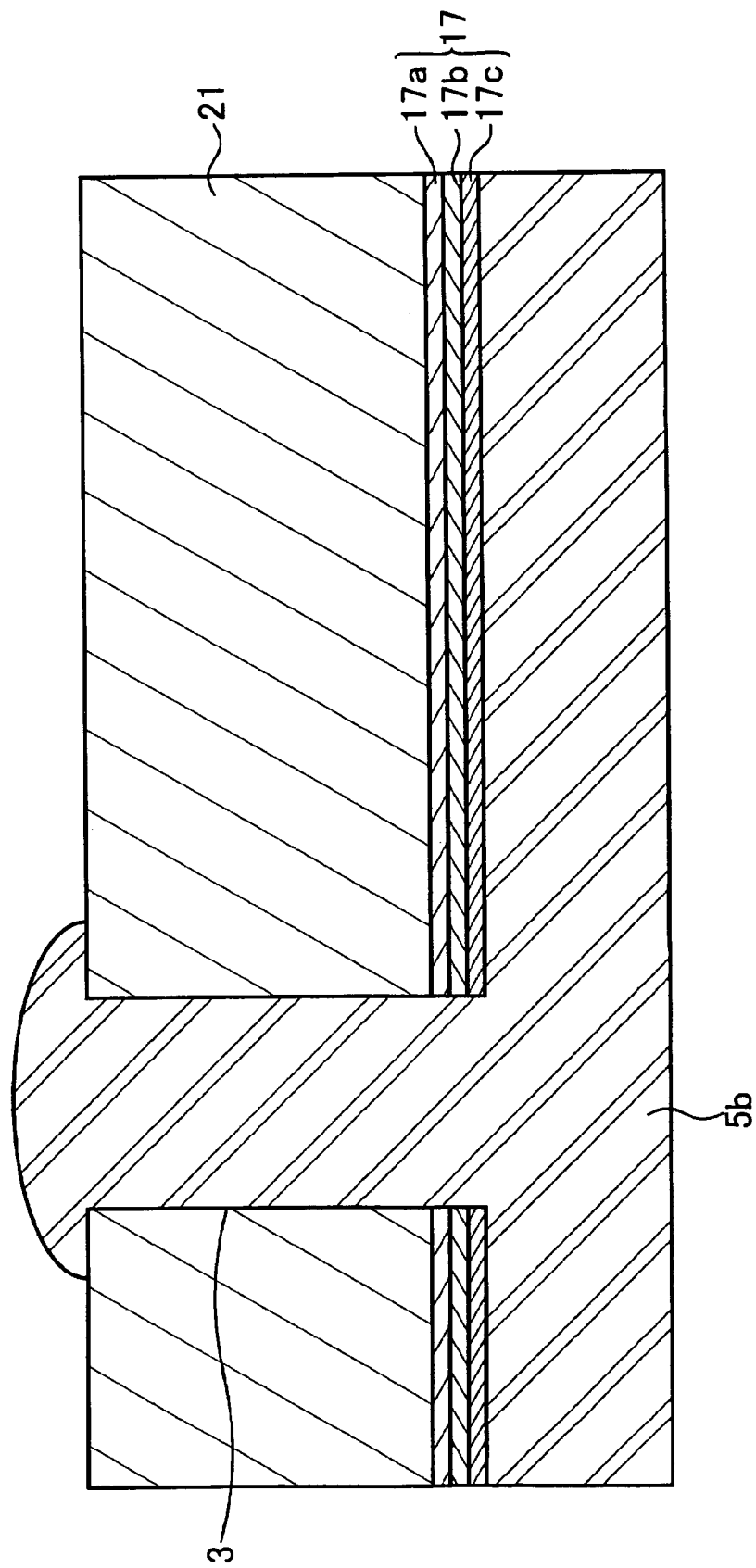
FIG. 8 is a second sectional view of an electrolytic plating step.
Figure 9:
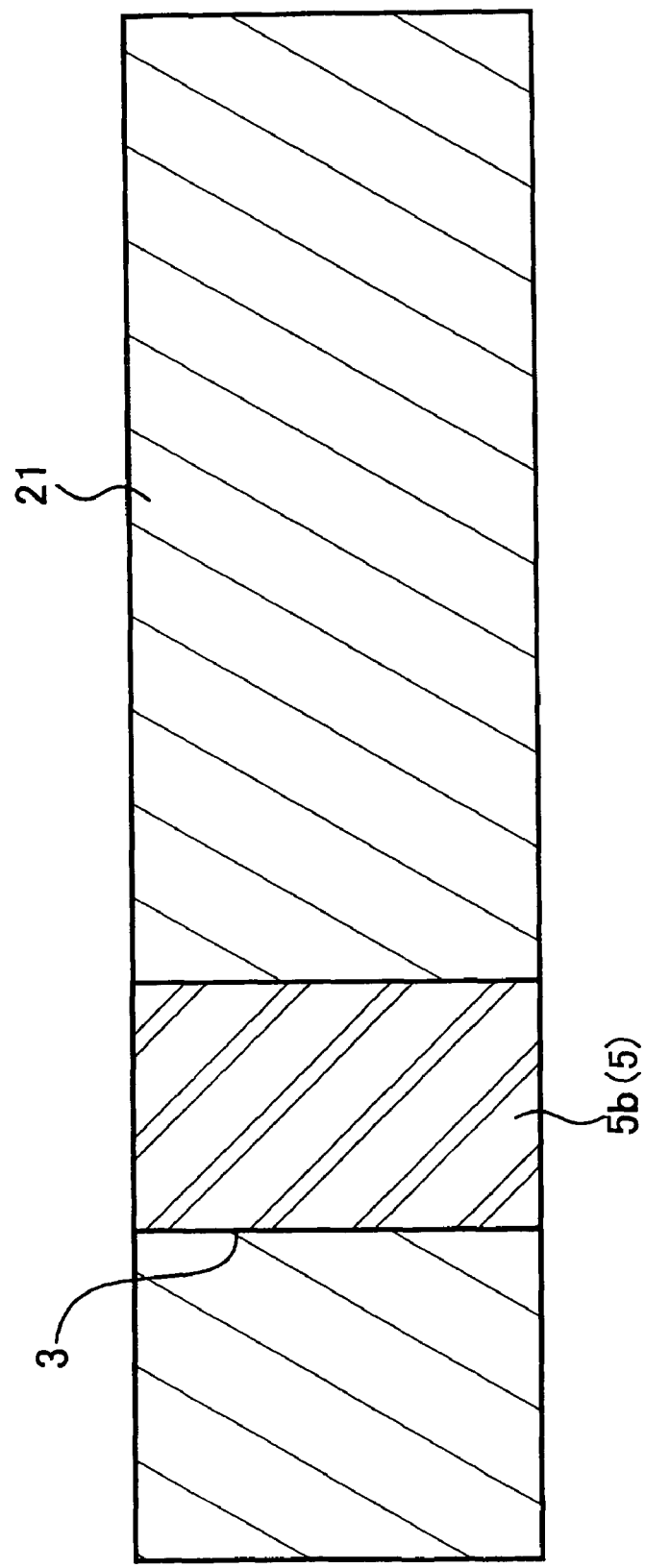
FIG. 9 is a sectional view of a metal layer removal step.

Next, the through-hole filling step will be described. FIGS. 5 to 9 are explanatory views of the through-hole filling step. FIG. 5 is a sectional view of an electrode layer formation step. FIG. 6 is a sectional view of an opening part sealing step. FIG. 7 is a first sectional view of an electrolytic plating step. FIG. 8 is a second sectional view of an electrolytic plating step. FIG. 9 is a sectional view of a metal layer removal step.

In the through-hole filling step, as shown in FIG. 5, on one surface side of the crystallized glass substrate 21 obtained after the glass substrate reforming step, that is, after subjecting the photosensitive glass substrate 2 to crystallization treatment, a chromium film having film thickness of about 0.05 μm is first formed to thereby form a sputtering chromium layer 17a. Next, a chromium copper alloy film having a film thickness of about 0.05 μm is formed on the layer 17a to thereby form the sputtering chromium-copper layer 17b. Then, a copper film having a film thickness of about 1.5 μm is formed on the layer 17b to thereby form the sputtering copper layer 17c. Thus, as shown in FIG. 5, an electrode layer 17 having a three-layer structure composed of the sputtering chromium layer 17a, the sputtering chromium-copper layer 17b and the sputtering copper layer 17c is formed on one surface side of the crystallized glass substrate 21. The electrode layer 17 acts as an electrode in forming a plating metal layer in the through-hole 3 using the after-described electrolytic plating method for filling the through-hole 3 with a metal. Hereinafter, a surface having formed thereon the electrode layer 17 is designated as a substrate rear surface and a surface opposite to the substrate rear surface is designated as a substrate front surface.

The electrode layer 17 has a structure such that a layer having good adhesion with both of the metal filling the through-hole 3 and the crystallized glass substrate 21 is formed on the substrate 21 using a sputtering method, a vacuum deposition method, and a CVD method. For example, the electrode layer 17 may have a three-layer structure such that a first layer composed of materials having good adhesion with the substrate 21, a third layer composed of materials having good adhesion with the metal filling the through-hole 3 and a second layer composed of both of the first layer materials and the third layer materials are laminated on the substrate 21 in the order corresponding to the first layer, the second layer and the third layer. When adhesion between the first layer and the third layer is sufficiently obtained, the layer 17 may also have a double-layer structure such that the second layer is omitted. Further, depending on the metal filling the through-hole 3 and the substrate 21 materials, the layer may also be formed by a single layer composed of materials having good adhesion with both the materials. When forming the electrode layer 17 having a multilayer structure, it is important that film formation for all the layers is performed continuously in an air-shutoff environment to prevent oxides from being produced between the layers.

In this embodiment, copper is used as a metal filling the through-hole 3. In this case, metal materials such as chromium, tantalum and titanium can be used for the electrode layer 17. Herein, the electrode layer 17 is formed using chromium, and has a three-layer structure composed of the sputtering chromium layer 17a, which has good adhesion with the crystallized glass substrate 21, the sputtering copper layer 17c, which has good adhesion with copper, and the sputtering chromium-copper layer 17b interposed between these layers. A thickness of each metal layer constituting the electrode layer 17 is not particularly limited. For example, the layer 17a preferably has a thickness of about 0.04 to 0.1 μm, the layer 17b as the intermediate layer preferably has a thickness of about 0.04 to 0.1 μm, and the layer 17c preferably has a thickness of about 0.5 to 1.5 μm.

After the formation of the electrode layer 17, an electrolytic plating layer (hereinafter, referred to as an "electrolytic plating copper layer") 5b composed of copper is formed by the electrolytic plating method, whereby the opening part of the through-hole 3 in the substrate rear surface side is sealed with this electrolytic plating copper layer 5b, as shown in FIG. 6. It is preferable that the electrolytic plating process is herein performed, for example, by applying current using a copper plate as an anode as well as using the substrate as a cathode in a state where a surface side having formed thereon the electrode layer 17 is faced to the copper plate in a plating bath of a copper sulfate aqueous solution as a plating solution. Depending on a diameter of the through-hole 3, the formation of the layer 5b is performed under the condition that a current density is relatively higher than usual from about 1 to 5 A/dm$^2$. Further, the current density also depends on a plating solution concentration and therefore, a value of the current density is appropriately set. Generally, in the case where the plating solution concentration is high, the current density can be set higher than a case where the plating solution concentration is low. By performing the electrolytic plating under these current density conditions, the opening part of the through-hole 3 in the substrate rear surface side can be sealed. Hereinafter, this plating process is referred to as "opening part-sealing plating".

Next, using the electrolytic plating copper layer 5b and the electrode layer 17 as a seed layer, the layer 5b is further formed by the electrolytic plating method, whereby the through-hole 3 is filled with the layer 5b together with the layer 5b previously formed within the through-hole 3 as shown in FIGS. 7 and 8. This electrolytic plating is performed under the condition that a current density is as relatively low as about 0.2 to 0.8 A/dm$^2$. Herein, the current density is set to 0.5 A/dm$^2$. Further, during the electrolytic plating, current is applied in a state where the substrate front surface side is faced to the anode in a plating bath. In this case, a so-called pulse plating method can also be used. The pulse plating method is effective in suppressing variation of deposition rate of the plating metal in the through-hole 3 inside. Further, it is important that an applied voltage is set to a hydrogen overvoltage or less. The reason is that when the through-holes 3 have a high aspect ratio, it is very difficult to remove hydrogen gas foam generated. Hereinafter, this plating process is referred to as "post plating".

By thus performing the electrolytic plating at different current densities, the through-hole 3 can be filled with metallic copper from one opening part side of the through-hole 3, that is, from the substrate rear surface side having formed thereon the electrode layer 17. As shown in FIG. 8, the electrolytic plating copper layer 5b may be projected and formed also on the substrate front surface side. Such a projecting part is removed using the lapping method.

Next, copper in the electrolytic plating copper layer 5b, the sputtering copper layer 17c and the sputtering chromium-copper layer 17b formed on the substrate rear surface is removed by etching using chemicals mainly composed of ferric chloride. Thereafter, chromium in the sputtering chromium-copper layer 17b and the sputtering chromium layer 17a is removed by etching using chemicals mainly composed of potassium ferricyanide. By thus removing the respective metal layers, there can be obtained a state where the front and rear surfaces of the crystallized glass substrate 21 are exposed as well as the through-hole 3 is filled with the electrolytic plating copper layer 5b, namely, the copper post 5 as shown in FIG. 9. Using such a filling method, the copper post 5 can be simply and effectively fill the through-hole 3.

Figure 10:
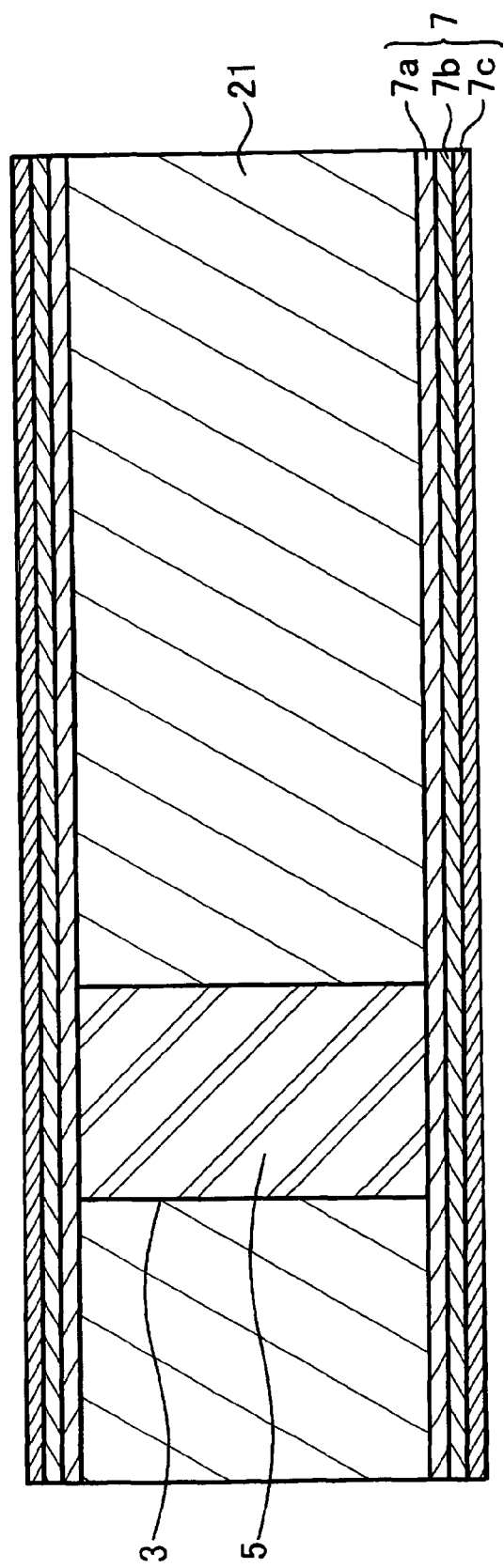
FIG. 10 is a sectional view of an adhesion-reinforcing layer formation step.

Next, the adhesion-reinforcing layer formation step will be described. FIG. 10 is a sectional view of the adhesion-reinforcing layer formation step.

In the adhesion-reinforcing layer formation step, the adhesion-reinforcing layer 7 is formed on a surface of the exposed crystallized glass substrate 21 after filling the through-hole 3 with of the copper post 5, as shown in FIG. 10. The layer 7 is a layer for securing adhesion between the substrate 21 and the copper film layer 6 subsequently formed as wirings. A material, layer structure and forming method of the layer 7 are the same as those of the electrode layer 17.

However, the adhesion-reinforcing layer 7 and the preliminary adhesion-reinforcing layer 17 have the following differences in a thickness thereof. That is, each of the metal layers constituting the layer 7 is preferably formed to have a thickness as small as possible, in view of the amount of side etching in the wiring pattern formation by etching described later. However, if the thickness of each of the metal layers constituting the layer 7 is too small, the layer 7 may be removed, before the wiring formation, through a treatment performed during the wiring formation, and therefore, attention is required. For example, in the case of using chromium for the layer 7, the sputtering chromium layer 7a preferably has a thickness of about 0.04 to 0.1 μm, the sputtering chromium-copper layer 7b as the intermediate layer preferably has a thickness of about 0.04 to 0.1 μm, and the sputtering copper layer 7c preferably has a thickness of about 0.5 to 1.5 μm. Thus, in this step, a very thin layer 7 with an overall thickness of 2 μm or less is formed.

Figure 11:
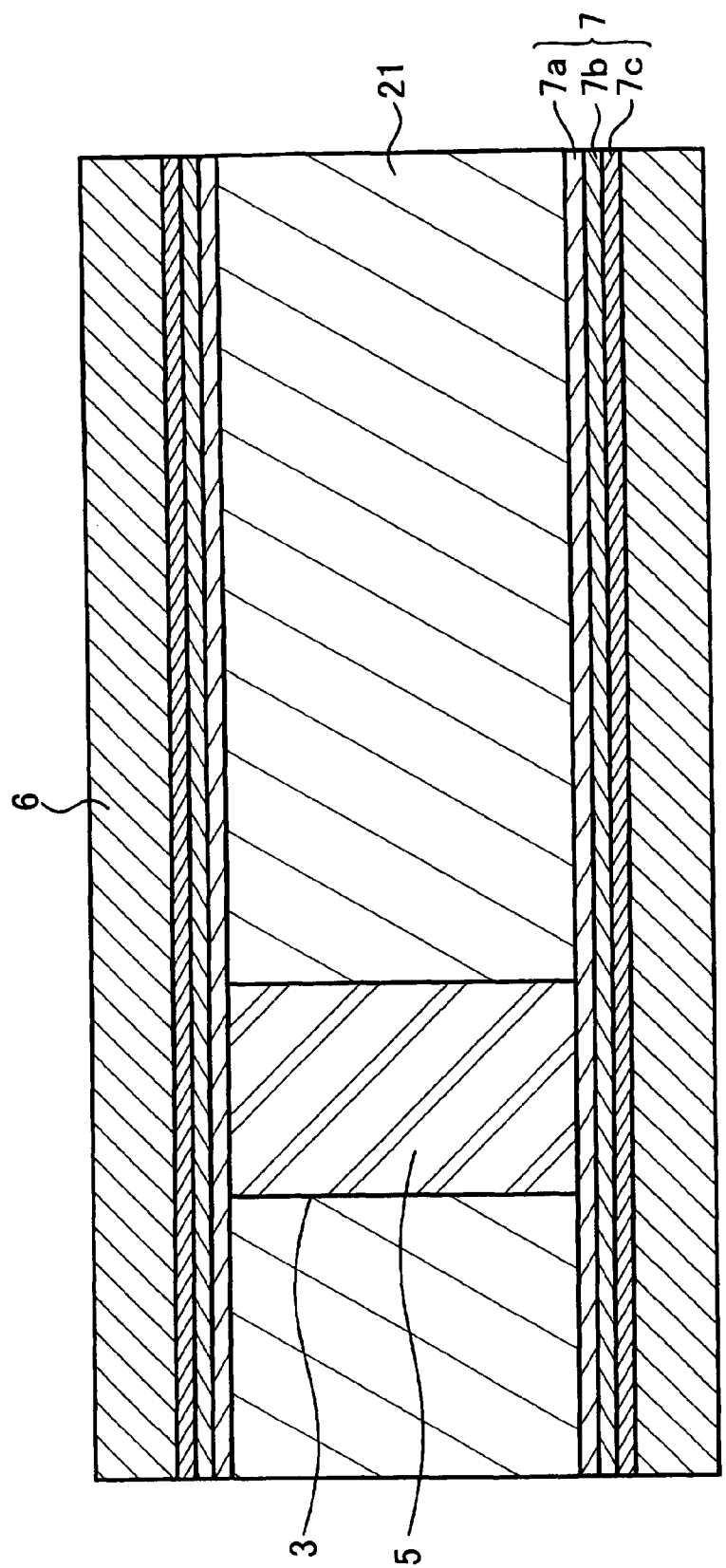
FIG. 11 is a sectional view of a wiring formation step.

Subsequently, the wiring formation step will be described. FIG. 11 is a sectional view of the wiring formation step.

In the wiring formation step, the copper film layer 6 is first formed on the adhesion-reinforcing layer 7 using the electrolytic plating method as shown in FIG. 11. In the same manner as in the layer 7, the copper film layer 6 is preferably formed to have a thickness as small as possible, in view of the amount of side etching. However, in the case where temperature changes of the double-sided wiring glass substrate 1 are repeated due to use environment, when the copper film layer 6 is too thin, metal fatigue may occur in the copper film layer 6 due to the difference in coefficient of thermal expansion between the copper film layer 6 and the crystallized glass substrate 21. Therefore, in order to ensure connection reliability of the copper film layer 6 against the metal fatigue, the copper film layer 6 needs to have a somewhat large thickness. The thickness of the copper film layer 6 is preferably set to about 1 to 20 μm, more preferably about 4 to 7 μm. If the thickness of the copper film layer 6 is smaller than 1 μm, it is highly possible that disconnection of the copper film layer 6 will be caused due to the metal fatigue described above; on the other hand, if the thickness of the copper film layer 6 is larger than 20 μm, it is difficult to form a fine wiring pattern.

After the formation of the copper film layer 6, a wiring pattern is formed by the photolithographic method and etching. First, a resist pattern corresponding to the wiring pattern of the double-sided wiring glass substrate 1 is formed using the photolithographic method. Next, the copper film layer 6, sputtering copper layer 7c, sputtering chromium-copper layer 7b and sputtering chromium layer 7a which are in areas not covered with the resist are removed by etching, thus forming the wiring pattern. As a result, the double-sided wiring glass substrate 1 having the constitution shown in FIG. 1 is obtained. The resist used herein may be a liquid resist, a dry film resist, or an electrodeposited resist. Also, the resist type may be either positive or negative; however, a positive resist is suited for the formation of fine wiring pattern since it generally provides higher resolution.

EXAMPLES

Next, the manufacturing method of the double-sided wiring glass substrate 1 will be described in more detail by giving a specific example.

The photosensitive glass substrate 2 used as a core substrate of the double-sided wiring glass substrate 1 is PEG3 (trade name) manufactured by HOYA CORPORATION. The PEG3 has the composition of $SiO_2$: 78.0% by weight, $Li_2O$: 10.0% by weight, $Al_2O_3$: 6.0% by weight, $K_2O$: 4.0% by weight, $Na_2O$: 1.0% by weight, ZnO: 1.0% by weight, Au: 0.003% by weight, Ag: 0.08% by weight and $CeO_2$: 0.08% by weight.

The manufacturing process of the double-sided wiring glass substrate 1 will be sequentially described below.

(Through-Hole Formation Step)

With a photomask brought into close contact with the photosensitive glass substrate 2, ultraviolet rays are emitted onto a through-hole formation part through the photomask, thereby forming a latent image corresponding to the exposed part. The photomask used comprises a silica glass substrate having formed on the surface thereof a desired pattern using a chromium/chromium oxide layer. Thereafter, the substrate 2 is subjected to thermal treatment at a temperature of about 400° C. to crystallize a through-hole formation part, thereby forming the exposed crystallized part 3a (FIG. 2). Thereafter, dilute hydrofluoric acid (about 10% solution) is sprayed on front and rear surfaces of the substrate 2 to remove by resolution the exposed crystallized part 3a. A diameter of the through-hole 3 obtained is about 50 μm (FIG. 3).

(Glass Substrate Reforming Step)

The whole photosensitive glass substrate 2 having formed therein the through-hole 3 is irradiated with ultraviolet rays in an exposure amount of about 700 mJ/$cm^2$, and then subjected to thermal treatment at a temperature of about 850° C. for about two hours. Thus, the crystallized glass substrate 21 is obtained.

(Through-Hole Filling Step)

Using a normal DC sputtering system, the electrode layer 17 is formed on the rear surface of the crystallized glass substrate 21 after passing through the glass substrate reforming Step. The electrode layer 17 is formed to have a three-layer structure, in which film formations for the sputtering chromium layer 17a having a film thickness of 0.05 μm, the sputtering chromium-copper layer (chromium: about 4%, copper: about 96%) 17b having a film thickness of 0.05 μm and the sputtering copper layer 17c having a film thickness of 1.5 μm are performed continuously in an air-shutoff environment (FIG. 5).

After the formation of the electrode layer 17, the opening part of the through-hole 3 in the front surface having formed thereon the electrode layer 17 of the crystallized glass substrate 21 is sealed with the electrolytic plating copper layer 5b using the opening part sealing plating (FIG. 6). On this occasion, a plating solution used is a commercially available plating solution for copper plating (LEVCO 300 copper sulfate plating solution manufactured by C. Uyemura & Co, Ltd). Further, current is applied in a state where the rear surface side of the crystallized glass substrate 21 having formed thereon the electrode layer 17 is faced to the anode in a plating bath.

Figure 12:
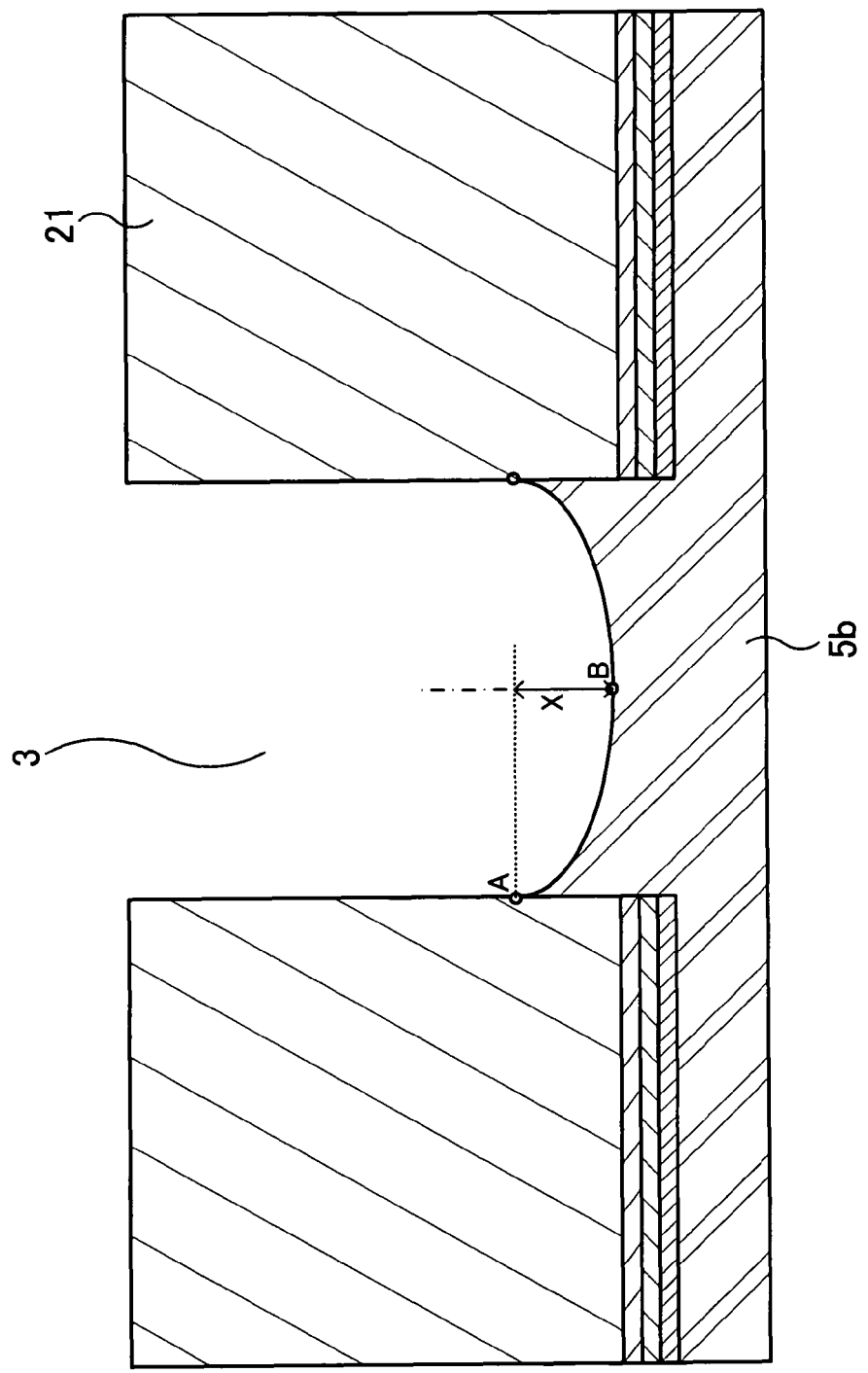
FIG. 12 schematically shows a state in a vicinity of a through-hole opening part subjected to opening part sealing plating.

FIG. 12 schematically shows a state in a vicinity of the through-hole opening part subjected to the opening part sealing plating. As shown in FIG. 12, the electrolytic plating copper layer 5b is formed in a concave shape in a central part of the through-hole 3. In FIG. 12, a point A indicates a position of the layer 5b in the sidewall part of the through-hole 3, and a point B indicates a position of the layer 5b in the central part of the through-hole 3. A character X is a vertical interval between the point A and the point B. A relation between the current density (A/$dm^2$) and X value (μm) during the opening part sealing plating is experimentally determined. As a result, there can be obtained the results shown in Table 1.

TABLE 1

| Current Density (A/$dm^2$) | X Value (μm) |
|---|---|
| 3 | 5 to 10 |
| 2 | 10 to 20 |
| 1 | >20 |

As shown in Table 1, the current density and the X value are in an inversely proportional relationship. From the results, it is revealed that as the current density more increases, the X value more decreases.

Samples subjected to the opening part sealing plating under the condition of different X values, that is, different current densities are subjected to post plating. As a result, it is revealed that as the X value more increases, the plating solution is more easily trapped in the vicinity of the point B. For example, in the case where the current density is 3 A/$dm^2$, trap of the plating solution in the vicinity of the point B is scarcely recognized; on the other hand, in the case where the current density is 1 A/$dm^2$, trap of the plating solution is remarkably recognized. Based on this result, the current density in the opening part sealing plating is herein set to 3 A/$dm^2$.

Using the above-described method, the post plating is performed by sealing, with the electrolytic plating copper layer 5b, one of the opening parts of the through-hole 3 and then performing rearrangement such that the opening part of the through-hole 3 in the substrate front surface side is faced to an anode in a plating bath. Thus, the through-hole 3 is filled with the electrolytic plating copper layer 5b (FIGS. 7 and 8). The current density during the post plating is set to 0.5 A/dm$^2$. The electrolytic plating copper layer 5b (FIG. 8) which projects on the substrate front surface side is removed using the lapping method.

Next, copper in the electrolytic plating copper layer 5b, the sputtering copper layer 17c and the sputtering chromium-copper layer 17b formed on the substrate rear surface is removed by etching using chemicals mainly composed of ferric chloride. Thereafter, chromium in the sputtering chromium-copper layer 17b and the sputtering chromium layer 17a is removed by etching using chemicals mainly composed of potassium ferricyanide. Thus, the through-hole 3 is filled with the copper post 5 (FIG. 9).

(Adhesion-Reinforcing Layer Formation Step)

After filling the through-hole 3 with the copper post 5, the adhesion-reinforcing layer 7 is formed using a normal DC sputtering system. The layer 7 is formed to have a three-layer structure, in which film formations for the sputtering chromium layer 7a having a film thickness of 0.05 μm, the sputtering chromium-copper layer (chromium: about 4%, copper: about 96%) 7b having a film thickness of 0.05 μm and the sputtering copper layer 7c having a film thickness of 1.5 μm are performed continuously in an air-shutoff environment (FIG. 10).

(Wiring Formation Step)

After the formation of the adhesion-reinforcing layer 7, a copper film having a film thickness of about 3.5 μm is formed using the electrolytic plating method to thereby form the copper film layer 6 serving as wirings (FIG. 11). A plating solution used is a commercially available copper sulfate plating solution (Copper Gleam ST-901 manufactured by Meltex Inc.). The current density condition is set to 3 A/dm$^2$.

After the formation of the copper film layer 6, a positive liquid resist (MICROPOSIT SJR5440 manufactured by SHIPLEY COMPANY) is applied to a thickness of about 10 μm by using a spinner. Then, a resist pattern composed of a desired wiring pattern is formed according to a usual photolithographic process. The amount of exposure onto the photoresist is set to 1000 mJ/cm$^2$. Using a developing solution (DEVELOPER 2500 manufactured by SHIPLEY COMPANY), development is performed by a dipping method at room temperature for about 1 minute.

Using the resist pattern as a mask, the layer 6 is sprayed with a solution of about 40-Baume ferric chloride to remove, by etching, copper in the copper film layer 6, the sputtering copper layer 7c and the sputtering chromium-copper layer 7b, and then the resist is removed using acetone. Subsequently, using the etched copper film layer 6 as a metal resist, etching is performed to remove chromium in the sputtering chromium-copper layer 7b and the sputtering chromium layer 7a using chemicals mainly composed of potassium ferricyanide. Thus, a wiring pattern with a line width of about 20 μm, a line spacing of about 20 μm and a through-hole land width of about 120 μm is formed.

Through the above-described steps, the double-sided wiring glass substrate 1 having the through-hole 3 filled with the copper post 5 formed by the electrolytic plating method is obtained (FIG. 1).

In this example, the same plating solution is used in the opening part sealing plating and the subsequent post plating. However, for the respective plating processes, there can be used more suitable plating solutions, for example, plating solutions each having a different plating metal ion concentration in the plating solution.

As described above, in the double-sided wiring glass substrate of the present invention, the through-hole for electrically connecting the substrate front and rear surfaces is filled with a metal, so that the substrate front and rear surfaces can be surely made electrically connective. Further, in the double-sided wiring glass substrate of the present invention, no conventional resin is used as filling materials of the through-hole, so that high thermal resistance as the whole substrate can be realized. Further, the plating method is used in filling the through-hole with a metal, so that the through-hole can be surely filled with a metal. Thus, according to the double-sided wiring glass substrate of the present invention, high-density mounting with high connection reliability of electronic parts can be realized.

In the above description, the case of using copper as a metal for filling the through-hole of the double-sided wiring glass substrate is described by way of example. In addition to copper, any metal having thermal resistance not less than a temperature for bonding surface-mounted electronic parts, such as, nickel (Ni), silver, gold, chromium and aluminum may be used without any trouble. Further, a plurality of these metals may be selected for use. Among these metals, copper is particularly suitable as a metal for filling the through-hole in terms of a high melting point, low resistance and price. Further, a material, layer structure and forming method of the electrode layer and the adhesion-reinforcing layer can be appropriately changed depending on a type of metals for filling the through-hole.

The manufacturing method of the double-sided wiring glass substrate of the present invention, in which the through-hole is filled with metals, can be applied also to a multilayer wiring substrate. Further, the manufacturing method can be applied also to a double-sided wiring substrate or multilayer wiring substrate using as a core substrate a ceramic substrate or a glass epoxy substrate.

According to the method for manufacturing a double-sided wiring glass substrate of the present invention, a through-hole is filled with a metal, so that the front and rear surfaces of the double-sided wiring glass substrate can be surely made electrically connective as well as thermal resistance thereof can be improved. As a result, there can be realized the double-sided wiring glass substrate allowing high-density mounting with high connection reliability of electronic parts.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a double-sided wiring glass substrate having electric wirings formed on the front and rear surfaces of a glass substrate, and a through-hole filled with a metal and penetrating the glass substrate, the respective electric wirings formed on the front and rear surfaces of the glass substrate being made electrically connective through the metal filling the through-hole, the method comprising the steps of:

a first step of forming the through-hole in the glass substrate;

a second step of forming an electrode layer having an opening part in an area corresponding to the through-hole on one surface of the glass substrate, and by an electrolytic plating method, sealing the opening part of the electrode layer with the metal at a first current density, and further by the electrolytic plating method, depositing the metal from the sealed opening part to an opening part of the through-hole of another surface of the glass substrate at a second current density lower than the first current density to fill the through-hole inside with the metal;

a third step of removing the electrode layer and the metal projecting from the through-hole on said another surface of the glass substrate from the glass substrate;

a fourth step of forming an adhesion-reinforcing layer on each of the front and rear surfaces of the glass substrate; and a fifth step of forming the electric wirings on the adhesion-reinforcing layer formed on each of the front and rear surfaces of the glass substrate, the electric wirings being electrically connective through the metal filling the through-hole.

2. The method according to claim 1, wherein the metal filling the through-hole is composed of any one or more of copper, nickel, gold, silver, chromium and aluminum.

3. The method according to claim 1, wherein a photosensitive glass substrate is used as the glass substrate, and the first step comprises:

a step of exposing the glass substrate through a photomask to form a latent image on a part of the glass substrate in which the through-hole is formed;

a step of subjecting the glass substrate to thermal treatment to crystallize the exposed part; and a step of removing by dissolving the crystallized part to form the through-hole in the glass substrate.

4. The method according to claim 1, wherein the adhesion reinforcing layer has a three layer structure.

5. The method according to claim 1, wherein the first current density is set to 1 to 5 $A/dm^2$, and the second current density is set to 0.2 to 0.8 $A/dm^2$.

* * * * *